United States Patent
Sejima et al.

(10) Patent No.: US 10,101,401 B2
(45) Date of Patent: Oct. 16, 2018

(54) ENERGY STORAGE DEVICE MANAGEMENT APPARATUS, ENERGY STORAGE DEVICE MANAGEMENT METHOD, ENERGY STORAGE DEVICE MODULE, ENERGY STORAGE DEVICE MANAGEMENT PROGRAM, AND MOVABLE BODY

(71) Applicant: GS Yuasa International Ltd., Kyoto-shi (JP)

(72) Inventors: Kenichi Sejima, Kyoto (JP); Takeyuki Shiraishi, Kyoto (JP); Yoshihiko Mizuta, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 154 days.

(21) Appl. No.: 15/056,915

(22) Filed: Feb. 29, 2016

(65) Prior Publication Data

US 2016/0259012 A1    Sep. 8, 2016

(30) Foreign Application Priority Data

Mar. 5, 2015 (JP) .................................. 2015-043456
Feb. 2, 2016 (JP) .................................. 2016-018035

(51) Int. Cl.
  *G01R 31/36* (2006.01)
(52) U.S. Cl.
  CPC ..... *G01R 31/3651* (2013.01); *G01R 31/3624* (2013.01)
(58) Field of Classification Search
  CPC . G01R 31/36; G01R 31/3651; G01R 31/3624
  (Continued)

(56) References Cited

U.S. PATENT DOCUMENTS

| 6,388,447 B1* | 5/2002 | Hall ..................... H02J 7/0047 324/426 |
| 2007/0145948 A1 | 6/2007 | Lim et al. | |

(Continued)

FOREIGN PATENT DOCUMENTS

| JP | 2000-166109 A | 6/2000 |
| JP | 2007-171205 A | 7/2007 |

(Continued)

OTHER PUBLICATIONS

Extended European Search Report dated Jul. 28, 2016.

*Primary Examiner* — Nathaniel Pelton
*Assistant Examiner* — Dung V Bui
(74) *Attorney, Agent, or Firm* — McGinn I.P. Law Group, PLLC.

(57) ABSTRACT

An energy storage device management method for deciding an SOC estimated value includes: preparing first and second SOC estimation methods for estimating an SOC; and employing a predetermined value as the SOC estimated value when a first SOC region and a second SOC region are different. V-SOC correlation between a voltage and the state of charge of the energy storage device is sectioned into a plurality of SOC regions. The first SOC region is the SOC region that the SOC estimated by the first SOC estimation method belongs to, and the second SOC region is the SOC region that the SOC estimated by the second SOC estimation method belongs to. The predetermined value is set to a value close to a boundary value on a side close to the first SOC region of boundary values sectioning the second SOC region, or a value between the boundary value and an intermediate value of the second SOC region.

20 Claims, 4 Drawing Sheets

(58) Field of Classification Search
USPC .......................................................... 324/426
See application file for complete search history.

(56) References Cited

U.S. PATENT DOCUMENTS

| | | | | |
|---|---|---|---|---|
| 2008/0231238 | A1* | 9/2008 | Wong | B60L 11/185 |
| | | | | 320/161 |
| 2010/0121591 | A1* | 5/2010 | Hall | G01R 31/3624 |
| | | | | 702/63 |
| 2012/0065824 | A1* | 3/2012 | Takahashi | G01R 31/361 |
| | | | | 701/22 |
| 2012/0109556 | A1 | 5/2012 | Syed et al. | |
| 2012/0166116 | A1 | 6/2012 | Yoshida et al. | |
| 2012/0176092 | A1 | 7/2012 | Fujii et al. | |
| 2012/0293131 | A1* | 11/2012 | Nakamura | G01R 31/361 |
| | | | | 320/134 |
| 2013/0063089 | A1* | 3/2013 | Shiraishi | H02J 7/0016 |
| | | | | 320/118 |
| 2013/0138370 | A1* | 5/2013 | Oh | G01R 31/3624 |
| | | | | 702/63 |
| 2013/0229154 | A1 | 9/2013 | Benjamin et al. | |
| 2013/0300425 | A1 | 11/2013 | Shiraishi et al. | |
| 2013/0335030 | A1* | 12/2013 | Joe | H01M 10/052 |
| | | | | 320/134 |
| 2014/0232410 | A1 | 8/2014 | Hayashi et al. | |

FOREIGN PATENT DOCUMENTS

| | | |
|---|---|---|
| JP | 2010-266221 A | 11/2010 |
| JP | 2012-225713 A | 11/2012 |
| JP | 2013-057537 A | 3/2013 |
| JP | 2013-134962 A | 7/2013 |
| JP | 5282789 B2 | 9/2013 |
| JP | 5556698 B2 | 7/2014 |
| JP | 5565276 B2 | 8/2014 |
| JP | 2014-160015 A | 9/2014 |
| JP | 2014-190723 A | 10/2014 |
| JP | 2014-199238 A | 10/2014 |
| JP | 2015-038437 A | 2/2015 |

* cited by examiner

ENERGY STORAGE DEVICE MANAGEMENT APPARATUS, ENERGY STORAGE DEVICE MANAGEMENT METHOD, ENERGY STORAGE DEVICE MODULE, ENERGY STORAGE DEVICE MANAGEMENT PROGRAM, AND MOVABLE BODY

CROSS-REFERENCE TO RELATED APPLICATIONS

This application claims the benefit of Japanese patent applications No. 2015-043456, filed on Mar. 5, 2015, and No. 2016-018035, filed on Feb. 2, 2016, which are incorporated by reference.

FIELD

A technique disclosed by the present specification relates to a technique of obtaining a state of charge (SOC) of an energy storage device such as a lithium ion battery.

BACKGROUND

Conventionally, there has been known a current integration method as one example of a method for estimating, at an optional time, an SOC of an energy storage device such as a secondary battery that is used while repeating charge and discharge. This is a method of measuring a watt-hour that is inputted/outputted with respect to a battery by measuring a charge-discharge current of the battery all the time, and adding or subtracting this charge-discharge current with respect to an initial available capacity in order to estimate the SOC. This method has an advantage that the SOC can be estimated during use of the battery. However, it has a disadvantage that a measurement error of a current sensor or the like is accumulated, so that measurement gradually becomes inaccurate, because the current is always measured to integrate a charge-discharge watt-hour.

Consequently, another method called an OCV method has been developed, in which an SOC estimation based on an open circuit voltage (OCV) of the battery is used in combination. There is a relatively accurate correlation between the OCV and SOC when a current is not flowing in/from the battery. Thus, a battery voltage when the current is not flowing in/from the battery (open circuit voltage) is measured in order to find the SOC corresponding to the measured OCV with reference to the correlation between the OCV and the SOC stored in advance, and to correct the SOC estimated by the current integration method. This allows the accumulation of error to be cut off, which can increase accuracy of the SOC estimation by the current integration method.

In recent years, a lithium ion battery using iron lithium phosphate as a positive active material has been gaining attention. It has been known that in this type of lithium ion battery, there exists in the OCV-SOC characteristics a flat (plateau) region where the OCV hardly changes while the SOC changes in a wide range as shown in FIG. 1, for example. In this type of lithium ion battery, correction of the error caused in the SOC estimation becomes difficult even by the OCV method.

In the case of a lithium ion battery having the OCV-SOC characteristics as in FIG. 1, if the OCV is, for example, about 3.33 V, which means that the OCV is in the voltage flat region, it can be only said that the SOC is any of 15% to 95%. Thus, in this type of battery, the OCV reset can be only conducted in a voltage inclination region where the OCV exhibits a certain degree of inclination in the OCV-SOC characteristics. Thus, the frequency of performing the OCV reset becomes lower, so that there has been a limit in the accuracy improvement of the SOC estimation.

The above-mentioned error of the SOC estimation may bring about an unfavorable situation of power deficiency, particularly in an electric car that uses a battery as a driving source. Thus, a solution to this problem is desired intensely.

In a technique disclosed in JP2010-266221 A, when it is detected that the SOC has changed from a value lower from a lower limit value in the voltage flat region into the voltage flat region by charge, the SOC is reset to the lower limit in the voltage flat region.

In the technique disclosed in JP2010-266221 A, after the battery is considerably discharged, the timing that the SOC changes from the value lower than the lower limit value of the voltage flat region into the voltage flat region is grasped. Thus, the frequency of performing the OCV reset is not necessarily high, so that there is a limit in the accuracy improvement.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

In the present specification, there is disclosed a technique that enables an SOC of an energy storage device to be acquired with a high accuracy.

According to an aspect of the present invention, there is provided an energy storage device management method for deciding an SOC estimated value, which is a value indicating a state of charge of an energy storage device, comprising: preparing first and second SOC estimation methods for estimating an SOC of the energy storage device in ways different from each other; and employing a predetermined value as the SOC estimated value when a first SOC region and a second SOC region are different from each other, wherein a V-SOC correlation between a voltage and the state of charge of the energy storage device is sectioned into a plurality of SOC regions, the first SOC region is the SOC region that the SOC estimated by the first SOC estimation method belongs to, and the second SOC region is the SOC region that the SOC estimated by the second SOC estimation method belongs to, and the predetermined value is set to 1) a value close to a boundary value on a side close to the first SOC region of boundary values sectioning the second SOC region, or 2) a value between the boundary value and an intermediate value of the second SOC region.

BRIEF DESCRIPTION OF DRAWINGS

The foregoing and other features of the present invention will become apparent from the following description and drawings of an illustrative embodiment of the invention in which.

DESCRIPTION OF EMBODIMENTS

Figure 1:
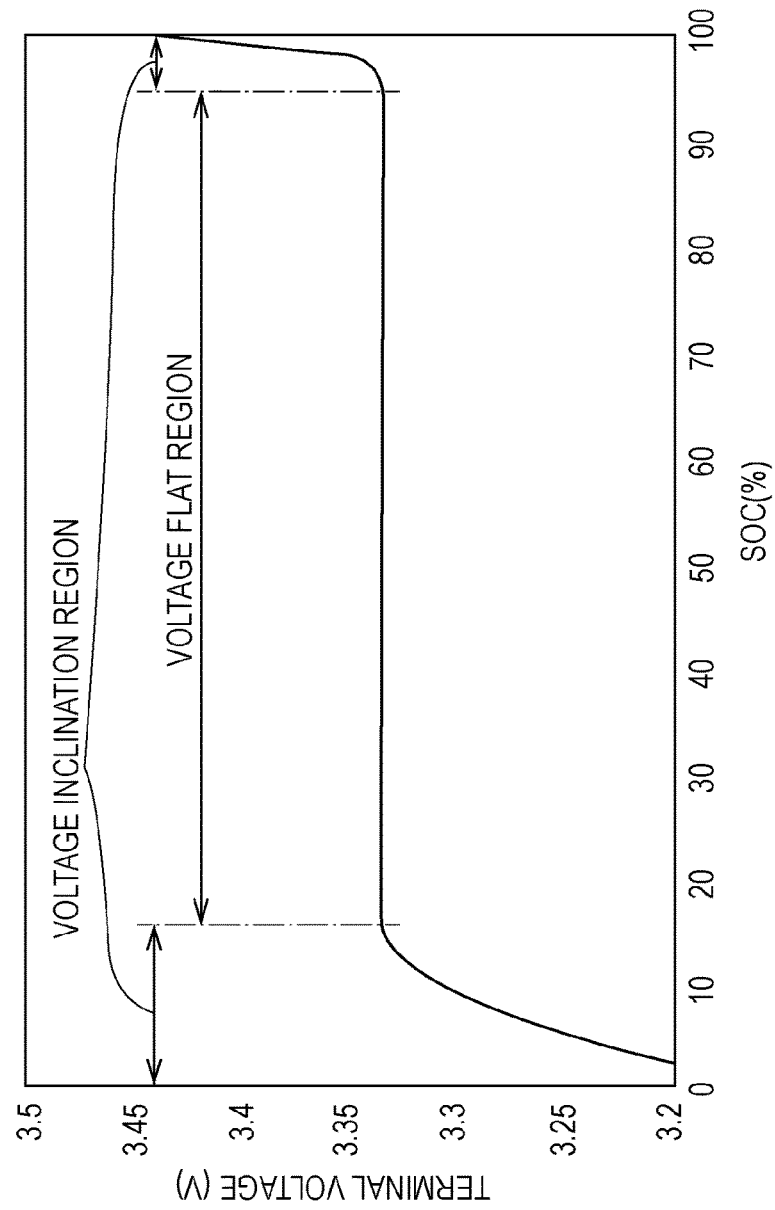
FIG. 1 is a graph showing one example of OCV-SOC characteristics of a lithium ion battery.

According to an aspect of the present invention, there is provided an energy storage device management method for deciding an SOC estimated value, which is a value indicating a state of charge of an energy storage device, comprising: preparing first and second SOC estimation methods for estimating an SOC of the energy storage device in ways different from each other; and employing a predetermined value as the SOC estimated value when a first SOC region and a second SOC region are different from each other, wherein a V-SOC correlation between a voltage and the state of charge of the energy storage device is sectioned into a plurality of SOC regions, the first SOC region is the SOC region that the SOC estimated by the first SOC estimation method belongs to, and the second SOC region is the SOC region that the SOC estimated by the second SOC estimation method belongs to, and the predetermined value is set to 1) a value close to a boundary value on a side close to the first SOC region of boundary values sectioning the second SOC region, or 2) a value between the boundary value and an intermediate value of the second SOC region.

According to another aspect of the present invention, there is provided an energy storage device management apparatus including an information processor that outputs an SOC estimated value, which is a value indicating a state of charge of an energy storage device, and executes first and second SOC estimation methods for estimating an SOC of the energy storage device in ways different from each other, wherein a V-SOC correlation between a voltage and the state of charge of the energy storage device is sectioned into a plurality of SOC regions, the information processor employs a predetermined value as the SOC estimated value when a first SOC region and a second SOC region are different from each other, the first SOC region being the SOC region that the SOC estimated by the first SOC estimation method belongs to, and the second SOC region being the SOC region that the SOC estimated by the second SOC estimation method belongs to, and the predetermined value is set to 1) a value close to a boundary value on a side close to the first SOC region of boundary values sectioning the second SOC region, or 2) a value between the boundary value and an intermediate value of the second SOC region.

The first SOC estimation method may be a method in which the SOC of the energy storage device is estimated, using data obtained by measuring a current flowing in/from the energy storage device, and the second SOC estimation method may be a method in which the SOC of the energy storage device is estimated, using data obtained by measuring the voltage of the energy storage device. With this configuration, an advantage can be obtained that accuracy can be improved by referring to a value obtained by the second SOC estimation method using the data obtained by measuring the voltage while taking advantage of real-time-estimation of the first SOC estimation method using the data obtained by measuring the current.

It is preferable that when the first SOC region and the second SOC region are the same, the SOC estimated based on the current integration method is employed as the SOC estimated value. Moreover, it is more preferable that one of the SOC regions is a region corresponding to a voltage flat region in which as to the voltage of the energy storage device, change of the voltage to the change of the SOC in the V-SOC correlation is smaller than that in the other region.

The technique disclosed in the present specification can be realized as an energy storage device management apparatus, an energy storage device management method, an energy storage device module, a movable body or a program implementing the device or the method.

According to the aspects of the present specification, an estimation error of the SOC of the energy storage device can be suppressed because the SOC obtained by the two methods is referred to.

(Outline of Present Embodiment)

First, an outline of an energy storage device management method and a device therefor of the present embodiment will be described. The present technique is to decide an SOC estimated value, which is a value indicating a state of charge of an energy storage device such as, for example, a lithium ion battery. The device includes a current sensor that detects a current flowing in/from the energy storage device, and a voltage sensor that detects a voltage when the current is not flowing in/from the energy storage device, or when a fine current is flowing. The energy storage device is mounted on a movable body such as a vehicle, a train, a ship, an airplane, and the like.

Among various types of energy storage devices, there is an energy storage device having a correlation relatively high in reproducibility between a voltage (V) and a state of charge (SOC), such as a lithium ion battery and the like. With respect to the energy storage device, the correlation is tabulated as a V-SOC correlation and stored in a memory in advance. For example, an information processor including a CPU and a memory that stores a necessary operation program is provided. This information processor can execute a current integration method in which a charge-discharge watt hour is found by time integration of the current detected by the current sensor to estimate the SOC of the energy storage device, and an OCV method in which the SOC is estimated, based on the V-SOC correlation from a detection result of the voltage sensor.

Based on what relation the respective SOCs estimated by the respective methods have, an SOC estimated value is decided. The V-SOC correlation is sectioned into a plurality of SOC regions in advance to determine which of the SOC regions the respective SOCs estimated by the current integration method and the OCV method belong to, and to decide the SOC estimated value as follows, based on whether the SOC regions are same or different.

(1) When the SOC region that the SOC estimated by the current integration method belongs to (this is referred to as a "first SOC region"), and the SOC region that the SOC estimated by the OCV method belongs to (this is referred to as a "second SOC region") are the same, the SOC estimated based on the current integration method is employed as the SOC estimated value.

(2) When the first SOC region and the second SOC region are different from each other, a predetermined value of the second SOC region (the region that the SOC acquired based on the OCV method belongs to) is employed as the SOC estimated value. The predetermined value is set between a boundary value on a side close to the first SOC region of boundary values sectioning the second SOC region, and an intermediate value of the second SOC region.

Examples of SOC regions to which the SOC that the energy storage device can take belong will be explained.

Suppose that from a region where the SOC is small to a region where the SOC is large, there is first an SOC region 1 where change of the voltage (V) to SOC change is larger than a predetermined value. Suppose there is next an SOC region 2 where the change of the voltage (V) to the SOC change is smaller than the predetermined value (a voltage flat region), and then there is an SOC region 3 where the change of the voltage (V) to the SOC change is larger than the predetermined value. As to how the SOC estimated by the current integration method (referred to as "SOC(I)") and the SOC estimated by the OCV method (referred to as "SOC(V)") belong to the respective regions, nine types (possible forms) 1 to 9 exist, as shown in table 1 below.

In these possible forms, the SOC estimated value to be employed according to the conditions of the above-described (1), (2) is described in an "SOC estimated value to be employed" column at a right end of table 1.

Here, the "SOC(I)" indicates the SOC estimated based on the current integration method.

"Upper half value in region 1" means a predetermined value of the SOC belonging to the SOC region 1 between an intermediate SOC of the region 1 (an intermediate value) and an upper limit value, which is a boundary value on a side of the region 2 to which the SOC(I) belongs.

"Lower half value in region 2" means a predetermined value of the SOC belonging to the SOC region 2 between an intermediate SOC of the region 2 (an intermediate value) and a lower limit value, which is a boundary value on a side of the region 1 to which the SOC(I) belongs.

"Upper half value in region 2" means a predetermined value of the SOC belonging to the SOC region 2 between the intermediate SOC of the region 2 (the intermediate value) and an upper limit value, which is a boundary value on a side of the region 3 to which the SOC(I) belongs.

"Lower half value in region 3" means a predetermined value of the SOC belonging to the SOC region 3 between an intermediate SOC of the region 3 (an intermediate value) and a lower limit value, which is a boundary value on the side of the region 2 to which the SOC(I) belongs.

TABLE 1

|  | SOC region 1 | SOC region 2 | SOC region 3 | SOC estimated value to be employed |
|---|---|---|---|---|
| Type 1 | SOC (V) & SOC (I) |  |  | SOC (I) |
| Type 2 | SOC (V) | SOC (I) |  | Upper half value in region 1 |
| Type 3 | SOC (V) |  | SOC (I) | Upper half value in region 1 |
| Type 4 | SOC (I) | SOC (V) |  | Lower half value in region 2 |
| Type 5 |  | SOC (V) & SOC (I) |  | SOC (I) |
| Type 6 |  | SOC (V) | SOC (I) | Upper half value in region 2 |
| Type 7 | SOC (I) |  | SOC (V) | Lower half value in region 3 |
| Type 8 |  | SOC (I) | SOC (V) | Lower half value in region 3 |
| Type 9 |  |  | SOC (V) & SOC (I) | SOC (I) |

According to the above-described method for deciding the SOC estimated value, the following advantages can be obtained.

As in types 1, 5, and 9, in the case where the region where the SOC(I) obtained by the current integration method belongs to (the first SOC region) and the region where the SOC(V) obtained by the OCV method belongs to (the second SOC region) are the same, the value of the SOC(I) can be relied on, so that the SOC(I) is employed as the SOC estimated value without performing a so-called OCV reset.

As in types 2 and 3, in the case where the region that the SOC(V) belongs to (the second SOC region) is the SOC region 1, the region that the SOC(I) belongs to (the first SOC region) is different from the SOC region 1 (the SOC region 2 or the SOC region 3), there is a high possibility that an error has accumulated in calculation in the current integration method. Consequently, in this case, the so-called OCV reset is performed with the predetermined value (the upper half value in region 1). The predetermined value is set between the intermediate SOC (the intermediate value) of the SOC region 1 (the second SOC region) and the upper limit value, which is the boundary value on the side of the region 2 or on the side of the region 3, which is the first SOC region that the SOC(I) belongs to. Thus, the accumulated error is reset or reduced. Such correction is performed, because it is indicated that the SOC exists in the SOC region 1 by the OCV method, and that the SOC by the current integration method is larger than that, so that it can be considered that setting the SOC estimated value to the upper half value in the SOC region 1 brings about a value closest to a true value. As the upper half value of the region 1, the upper limit value or a value close to the same is preferable.

As in type 4, in the case where the region that the SOC(V) belongs to (the second SOC region) is the SOC region 2 and the region where the SOC(I) belongs to (the first SOC region) is the SOC region 1, there is also a high possibility that the error has accumulated in the calculation by the current integration method. Consequently, in this case, the so-called OCV reset is performed with the predetermined value of the SOC belonging to the SOC region 2, which is the second SOC region (the lower half value in region 2). The predetermined value is set between the intermediate SOC (the intermediate value) of the region 2 and the lower limit value, which is the boundary value on the side of the region 1. Thus, the accumulated error can be reset or reduced.

As in type 6, in the case where the second SOC region (the region that the SOC(V) belongs to) is the SOC region 2 and the first SOC region (the SOC region that the SOC(I) belongs to) is the SOC region 3, there is also a high possibility that the error has accumulated in the calculation by the current integration method. Consequently, in this case, the so-called OCV reset is performed with the predetermined value of the SOC belonging to the second SOC region (the SOC region 2) (the upper half value in region 2). The predetermined value is set between the intermediate SOC (the intermediate value) of the second SOC region and the upper limit value, which is the boundary value on the side of the first SOC region (the SOC region 3 that the SOC(I) belongs to). Thus, the accumulated error is reset or reduced.

As in types 7 and 8, in the case where the second SOC region that the SOC(V) belongs to is the SOC region 3 and the first SOC region that the SOC(I) belongs to is the SOC region 1 or the SOC region 2, there is also a high possibility that the error has accumulated in the calculation by the current integration method. Consequently, in this case, the so-called OCV reset is performed with the predetermined value of the SOC belonging to the SOC region 3, which is the second SOC region (the lower half value in region 3). The predetermined value is set between the intermediate SOC (the intermediate value) of the region 3 and the lower limit value, which is the boundary value on the side of the SOC region 1 or the side of the SOC region 2, which is the first SOC region. Thus, the accumulated error is reset or reduced. Such correction is performed, because it is indicated that the SOC exists in the SOC region 3 by the OCV method, and that the SOC by the current integration method is smaller than that, so that it can be considered that setting the SOC estimated value to the lower half value in the SOC region 3 brings about a value closest to a true value. As the lower half value in region 3, the lower limit value or a value close to the same is preferable.

The value can be corrected with high frequency by the reset processing when the SOC regions that the SOC(I) and the SOC(V) belong to are different, while deciding the SOC based on the current integration method, which brings about advantages that the SOC can be estimated during use of the energy storage device. Also, the accumulation of the error, which is a disadvantage of the current integration method, is prevented, thereby increasing the accuracy of the SOC estimated value.

In order to find the SOC of a battery having a plateau region by the current integration method with high accuracy, high-speed current integration processing needs to be performed so as not to miss the current value from time to time. Also, current measurement means with high measurement accuracy has to be used. Thus, the cost is increased to realize the foregoing. There is proposed a method in which in order to increase the accuracy of the SOC estimation of the battery having the plateau region, dV/dQ is calculated to grasp an inflection point in OCV-SOC characteristics. However, when this method is implemented, highly advanced arithmetic operation and a large-capacity memory are required for grasping the flection point, so that the cost is also increased to realize this, and it is anticipated to require an enormous amount of time for verification work. In contrast, the present embodiment is a method for determining whether or not the SOC including the error of the current measurement means is in the certain SOC range. The present embodiment does not require high-accuracy current measurement means, and the processing is easier, as compared with the means in which the dV/dQ is arithmetically operated.

An energy storage device management apparatus according to the technique disclosed in the present specification is preferable when the energy storage device having the characteristics with the voltage flat region in the V-SOC correlation is managed, a lithium ion battery using an iron-phosphate based positive active material is exemplified as a management object. Particularly, it is preferable when the state of charge of a lithium ion battery, in which plural voltage flat regions exist, is estimated. When plural voltage flat regions exist, a voltage inclination region exists between these regions. Thus, by using a difference in results by the current integration method and the OCV method, the reset processing can be performed with high frequency, and the accuracy of the SOC estimated value is increased.

(Details of Embodiment)

Figure 2:
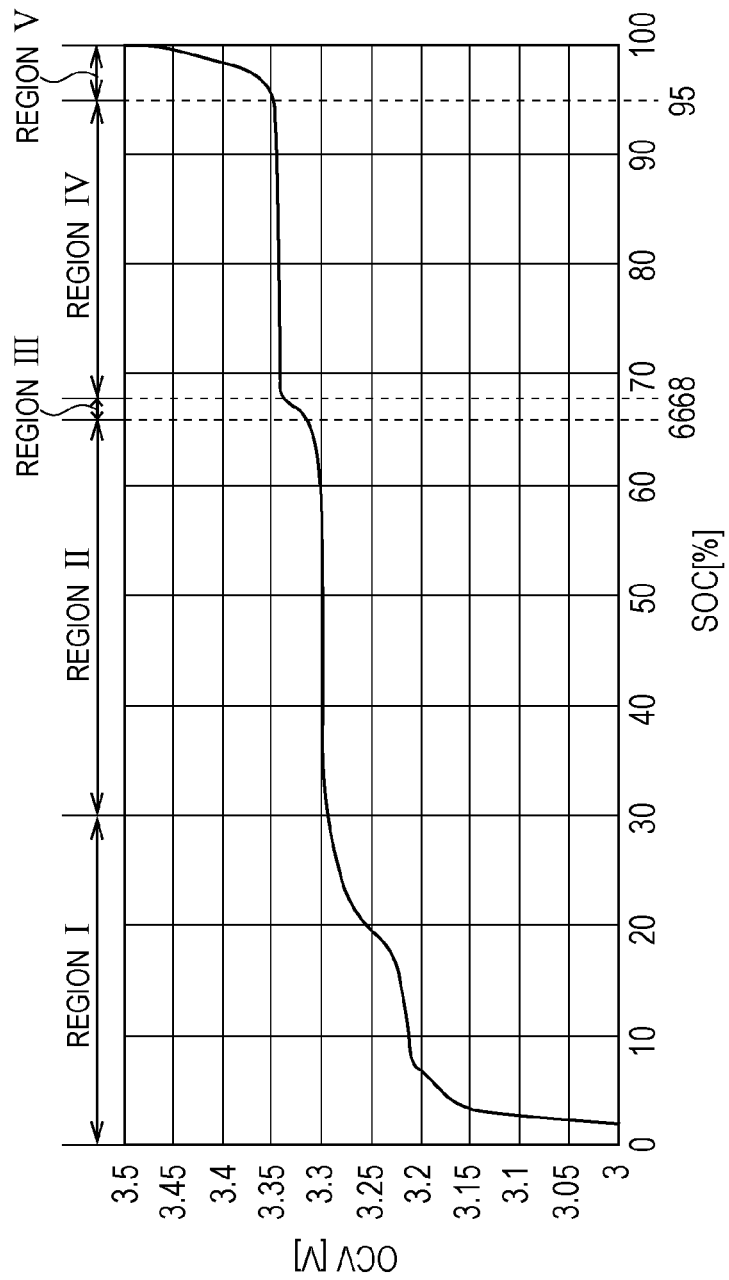
FIG. 2 is a graph showing an example of OCV-SOC characteristics of a lithium ion battery according to an embodiment.

Hereinafter, an embodiment in which the technique disclosed in the present specification is applied to a battery module for driving an electric motor vehicle such as an EV, an HEV, a PHEV and the like will be described in detail with reference to FIGS. 2 to 4.

Figure 3:
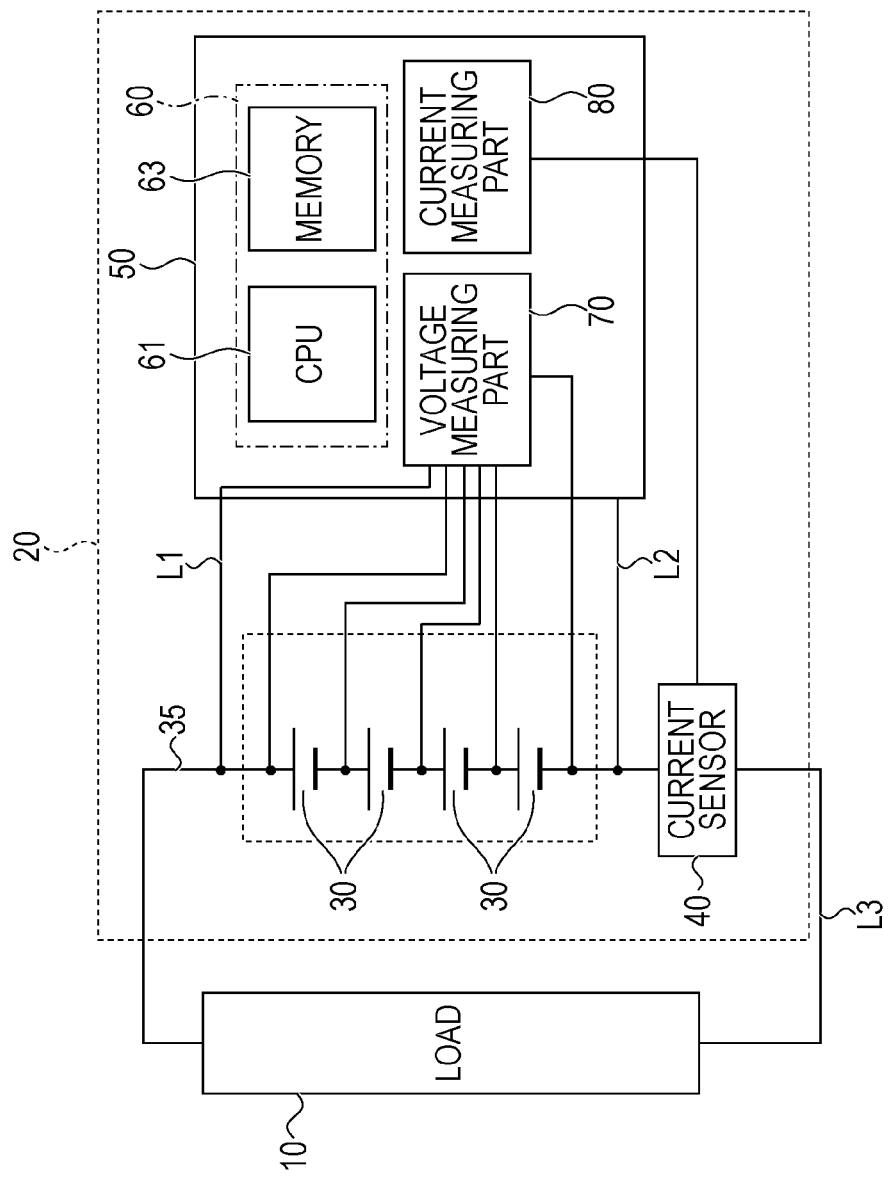
FIG. 3 is a block diagram showing a configuration of a battery module of an embodiment.
Figure 4:
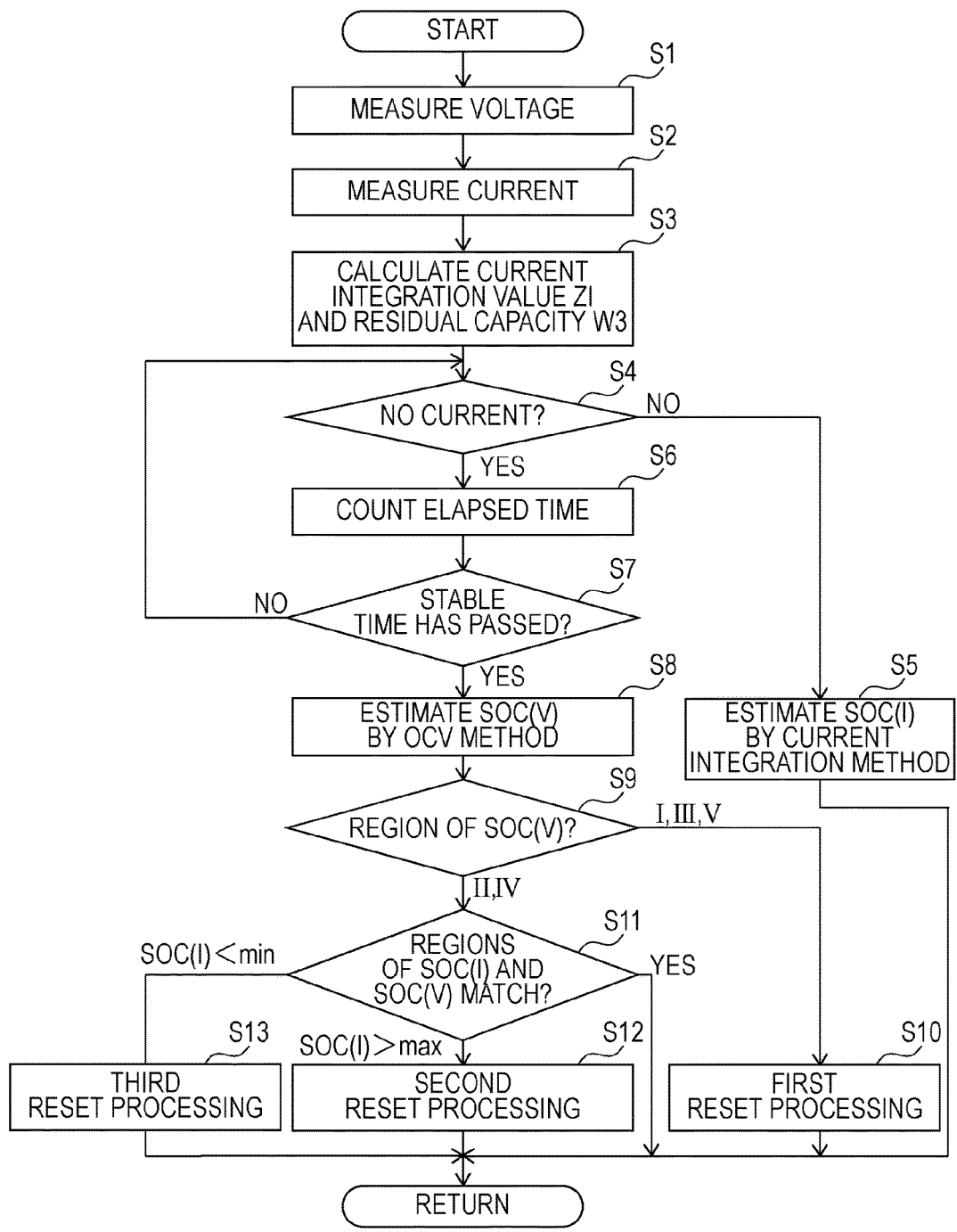
FIG. 4 is a flowchart showing a flow of an SOC decision sequence.

As shown in FIG. 3, the battery module of the present embodiment has a plurality of secondary batteries 30 connected in series, a battery manager (hereinafter, BM) 50 that manages these secondary batteries 30, and a current sensor 40 that detects a current flowing in/from each of the secondary batteries 30. The BM 50 is one example of the "energy storage device management apparatus".

Each of the second batteries 30 is one example of the "energy storage device", and is charged by a charger not shown, and supplies a direct current power to an inverter (illustrated as a load 10) that drives a motor for driving the vehicle or the like. These secondary batteries 30 are each a lithium ion battery using, for example, a negative active material of a graphite based material and an iron-phosphate based positive active material such as LiFePO4. There is a correlation (here, referred to as a "V-SOC correlation") shown in FIG. 2 between the open circuit voltage (OCV) and the state of charge (SOC). In this V-SOC correlation, the state of charge of the secondary battery 30 is divided into the following five regions for consideration.

| Region | Range of SOC |
| --- | --- |
| Region I | Less than 30% |
| Region II | 30%-less than 66% |
| Region III | 66%-less than 68% |
| Region IV | 68%-less than 95% |
| Region V | 95% or more |

In the three regions I, III, V of these regions, an OCV curve of the battery corresponding to the SOC has a certain degree of right-upward inclination, that is, change of the voltage (OCV) to the change of the state of charge (SOC) is relatively large, and is a predetermined value or more. These are defined as the "voltage inclination regions" I, III, V.

In contrast, in the regions (regions II, IV) other than the above-described voltage inclination regions I, III, V, the inclination of the OCV curve of the battery corresponding to the SOC is extremely small, that is, the change of the voltage (OCV) to the change of the state of charge (SOC) is the predetermined value or less. These regions are defined as the "voltage flat regions" II, IV.

The BM 50 includes a controller 60, a voltage measuring part 70, and a current measuring part 80. The controller 60 includes a central processing unit (hereinafter, CPU) 61 as an information processor, and a memory 63. In the memory 63, various programs for controlling operation of the BM 50 are stored, and the CPU 61 executes an SOC decision sequence that includes "SOC estimation processing in a current integration method", "SOC estimation processing in a voltage reference method", "first reset processing", "second reset processing", "third reset processing" described later in accordance with the program read from the memory 63. In the memory 63, data necessary for the execution of the above-described SOC decision sequence, for example, the tabulated V-SOC correlation of the secondary batteries 30, an upper limit and a lower limits of the state of charge in each of the regions I to V, the initial state of charge of the secondary batteries 30 as an initial value, and the like are stored.

The voltage measuring part 70 is connected to both ends of each of the secondary batteries 30 through voltage detection lines to serve a function of measuring a voltage V [V] of each of the secondary batteries 30 every predetermined period. The current measuring part 80 has a function of measuring a current flowing in/from the secondary batteries 30 through the current sensor 40.

The SOC decision sequence in which the SOC of the secondary battery 30 is decided will be described with reference to FIG. 4. The SOC decision sequence is started, for example, by the BM 50 receiving an execution command from an ECU (illustration is omitted) mounted on the vehicle, and a series of steps shown in FIG. 4 is executed repeatedly in a prescribed cycle T by a command of the controller 60 after starting.

When SOC decision sequence starts, first, processing of measuring the voltage of each of the secondary batteries 30 is executed by the voltage measuring part 70 (S1). Next, the controller 60 gives a command to the current measuring part 70 to perform processing of measuring the current flowing in/from the secondary battery 30 by the current sensor 40 (S2). A voltage value measured in S1 and a current value measured in S2 are converted to digital values, and then stored in the memory 63.

Thereafter, the processing shifts to S3, in which as shown in the following expressions (1) and (2), the controller 60 multiplies the current value I measured in S2 by the prescribed cycle T to calculate a current integration value ZI. Moreover, the calculated current integration value ZI is added to or subtracted from a residual capacity W3 at that time in accordance with a direction of the current to thereby calculate the new residual capacity W3 of the secondary battery 30. That is, every time the SOC decision sequence is performed once, the current integration value ZI is added to or subtracted from the residual capacity W3 (a previous value) to thereby update a value of the residual capacity W3.

$$ZI = I \times T \quad (1)$$

$$W3 = W3 + ZI \quad (2)$$

Thereafter, the processing shifts to S4, in which whether or not the current is flowing in/from the secondary battery 30 at that time is determined. If the secondary battery 30 is under charge or under discharge and the current is flowing, it is a state where the current value becomes above a determination reference value, so that in S4, NO is determined. If in S4, NO is determined, the processing shifts to S5. In S5, the processing of estimating the SOC of the secondary battery 30 by the current integration method is executed in the controller 60. Specifically, as indicated by the following expression (3), the residual capacity W3 calculated in S3 is divided by a full charge capacity W4 stored in the memory 63 to thereby obtain the value of the SOC.

$$SOC = W3/W4 \quad (3)$$

The processing undergoing the above-described S1, S2, S3, S5 corresponds to the SOC estimation processing in the current integration method, in which the charge-discharge watt hour is found by time integration of the current to decide the state of charge of the secondary battery 30. Hereinafter, the SOC estimated in S5 is referred to as an SOC(I).

The processing of one cycle ends with completion of the processing in S5. Thereafter, the SOC decision sequence is executed repeatedly in the prescribed cycle T. In a period when the discharge or the charge of the secondary battery 30 is continued, the processing in S1 to S5 is performed repeatedly in the prescribed cycle T, the values of the voltage value V, the current value I, and the residual capacity W3 of the secondary battery 30 are updated each time (S1 to S3), and the SOC is also calculated, using the current integration method each time (S5).

By charge completion or discharge end of the secondary battery 30, the current I flowing in/from the secondary battery 30 is made smaller than a predetermined value (a value that allows the current to be considered to be zero), YES is determined in S4, and the processing shifts to S6. In S6, processing of counting an elapsed time after the current stops flowing in the secondary battery 30 is executed.

Thereafter, the processing shifts to S7, and processing of determining that a stable time (a predetermined time set in advance) has passed is executed in the controller 60. The stable time is a time for waiting for the OCV (open circuit voltage) of the secondary battery 30 to become stable, and when the elapsed time measured in S7 becomes the stable time, YES is determined in S7, and the processing shifts to S8.

In S8, processing of estimating the SOC of the secondary battery 30 based on the OCV method is executed by the controller 60. Specifically, first, processing of measuring the OCV (the open circuit voltage in the state where the current is not flowing) of the secondary battery 30 is executed by the voltage measuring part 70. The SOC is decided from the measured OCV with reference to the correlation characteristics of the V-OCV shown in FIG. 2. This S8 corresponds to the SOC estimation processing in the voltage reference method in which the state of charge is estimated based on the detection result of the voltage sensor and the V-SOC correlation. Hereinafter, the SOC decided in this S8 is referred to as an SOC(V).

Thereafter, the processing shifts to S9, and which region of the regions I to V a value of the SOC(V) belongs to is determined. If it is determined that the SOC(V) belongs to any of the voltage inclination regions I, III, V, the processing shifts to S10 to perform the first reset processing, in which the SOC(I) acquired by the foregoing SOC estimation processing in the current integration method is replaced by the SOC(V) decided by the SOC decision processing in the voltage reference method in S8. Since in the voltage inclination regions I, III, V, there is an accurate correlation between the OCV and the SOC, the SOC(I) acquired by the SOC estimation processing in the current integration method in S5 can be corrected to a more accurate value, which increases the accuracy in the SOC decision sequence.

If in S9, it is determined that the SOC region that the SOC(V) belongs to (the second SOC region) is the voltage flat region II or IV, it is continuously determined whether or not this matches with the SOC region that the SOC(I) belongs to (the first SOC region) (S11). If both the regions of the SOC match, that is, if the SOC(I) exists between the lower limit value and the upper limit value of the voltage flat region II or IV, correction based on the V-SOC correlation is not performed, and the processing ends. Accordingly, as the SOC, the SOC(I) acquired by the SOC estimation processing in the current integration method in S5 is continuously used. This is because in these voltage flat regions II and IV, the SOC(V) has a high possibility of including a relatively large error due to the flatness in the V-SOC correlation. If, as in the related art, the correction is uniformly performed, based on the V-SOC correlation, the error becomes large.

In S11, if it is determined according to the SOC(V) that the region is the voltage flat region II or IV but it is also determined that the value of the SOC(I) is larger than the upper limit value of each of both the voltage flat regions II or IV, the processing shifts to S12 to replace the value of the SOC(I) to the upper limit of the relevant flat region (the second reset processing).

If it is indicated that SOC(V) is in the region II, the true SOC should be any of 30% to 66% based on the V-SOC correlation; however, it is difficult to specify which value the SOC takes (because the error may spread if it is specified). If the SOC(I) is not less than 66%, which is the upper limit SOC of the region II, a possibility that the true SOC is around 66% is extremely high. Consequently, the SOC is corrected to the upper limit value 66% of the region II. If it is indicated that the SOC(V) is in the region IV but the SOC(I) is not less than 95%, which is the upper limit SOC of the region IV, a possibility that the true SOC is around 95% is extremely high. Consequently, the SOC is corrected to the upper limit value 95% of the region IV. With this, the error that may have been included in the SOC(I) can also be reduced.

In S11, if it is determined according to the SOC(V) that the region is the voltage flat region II or IV but the value of the SOC(I) is smaller than the lower limit value of each of both the voltage flat regions II or IV, the processing shifts to S13 to replace the value of the SOC(I) to the lower limit of the relevant flat region (the third reset processing).

If it is indicated that SOC(V) is in the region II, the true SOC should be any of 30% to 66% based on the V-SOC correlation; however, it is difficult to specify which value the SOC takes (because the error may spread if it is specified). If the SOC(I) is not more than 30%, which is the lower limit SOC of the region II, a possibility that the true SOC is around 30% is extremely high. Consequently, the SOC is corrected to the lower limit value 30% of the region II. If it is indicated that the SOC(V) is in the region IV, the SOC should be any of 68% to 95% based on the V-SOC correlation, however, it is difficult to specify which value the SOC takes (because the error may spread if it is specified). I the SOC(I) is not more than 68%, which is the lower limit SOC of the region IV, a possibility that the true SOC is around 68% is extremely high. Consequently, the SOC is corrected to the lower limit value 68% of the region IV. With this, the error that may have been included in the SOC(I) can also be reduced.

<Other Embodiments>

The present invention is not limited to the embodiment described in the foregoing description and the drawings, but for example, the following embodiments are also included in a technical range of the present invention.

(1) While in the above-described embodiment, the lithium ion secondary battery using the iron-phosphate based positive active material is described as one example of the energy storage device, the present invention is not limited thereto. A secondary battery other than the lithium ion secondary battery, a capacitor accompanying an electrochemical phenomenon, or the like may be employed. The present invention is preferable for an energy storage device having the voltage flat region in the V-SOC correlation, and the energy storage device is not limited to that having two voltage flat regions, but may be an energy storage device of a type having only one voltage flat region as shown in FIG. 1, or may be an energy storage device of a type having three or more voltage flat regions.

(2) In the above-described embodiment, the CPU 61 is described as one example of the controller 61. The controller 60 may have a configuration including a plurality of CPUs, a configuration including a hardware circuit such as an ASIC (Application Specific Integrated Circuit), an MPU, a microcomputer, a programmable PLD, an FPGA and the like, or a configuration including both the hardware circuit and the CPU. In short, the controller only needs to execute the above-described SOC decision sequence, using software processing or/and the hardware circuit. Moreover, when the present invention is carried out using software, the software (a computer program) can be recorded on a storage medium such as a semiconductor memory and the like to be distributed, or be stored in a storage device of a computer through a wired or wireless communication circuit.

(3) In the above-described embodiment, the SOC is found from the measured OCV in order to determine to which region of the V-SOC correlation the SOC of the secondary battery 30 belongs. If the OCV and the SOC have a unequivocal correlation, the region may be determined directly from the OCV.

(4) The method of estimating the SOC of the energy storage device using the data obtained by measuring the voltage of the energy storage device is not limited to the OCV method exemplified in the above-described embodiment. Alternatively, a method of estimating the OCV from the charged-discharged I, V, and R, or a Kalman method can be employed. Here, the former is a method in which the OCV is calculated, based on a relation of OCV=V−RI, where an internal resistance of the battery is R, a terminal voltage of the battery is V, and a charge-discharge current is I. The Kalman method is a method in which an equivalent circuit model of the battery is created to successively estimate a circuit parameter of the model, using a Kalman filter, and to calculate the OCV, eventually the SOC from the estimated circuit parameter as disclosed, for example, in JP2004-514249 A, JP2012-47580 A, and the like.

(5) The method of estimating the SOC of the energy storage device using the data obtained by measuring the current flowing in/from the energy storage device is not limited to the so-called current integration method in which the current flowing in/from the energy storage device is measured in a constant cycle, and IT obtained by multiplying a measured current value I by a cycle T is added to, or subtracted from an initial capacity X(Ah) to find the SOC. If the current value that can be considered to be constant can be found, a time integration method can also be employed. The time integration method is a method in which a time T when the current value flowing in/from the energy storage device remains in a predetermined range, which allows the current to be considered to be constant, is measured, and a value obtained by multiplying a deemed constant current I by the time T is added to, or subtracted from the initial capacity X(Ah) to find the SOC.

(6) In the above-described embodiment, when the first SOC region and the second SOC region are the same, that is, the region that the SOC estimated by the current integration method belongs to and the region that the SOC estimated by the OCV method belongs to are the same, the SOC estimated based on the current integration method is employed as the SOC estimated value. However, the present invention is not limited thereto, but when both the regions are the same, a value obtained by correcting the SOC estimated based on the current integration method in accordance with the SOC estimated by the OCV method or the like may be decided as the SOC estimated value. Which of the SOCs estimated by the first and second SOC decision methods is to be employed may be decided in accordance with a temperature or the current value of the energy storage device.

(7) When the SOC of the energy storage device is estimated using the data obtained by measuring the current flowing in/from the energy storage device, if the SOC is less than a lower limit of the assumed SOC range, it can be considered that the SOC estimated value deviates in a discharge direction. Consequently, in this case, the measured current value is offset to a charge side, which can improve the accuracy of the SOC estimation. Conversely, if the estimated value of the SOC exceeds an upper limit of the SOC range, the measured current value is offset to a discharge side, which can improve the accuracy of the SOC estimation. When the measured current value is offset in this manner but the deviation of the SOC range still does not change, then it may be determined that the current measurement means have defect.

(8) In the above-described embodiment, the example in which the energy storage device is mounted on a movable body such as an electric motor vehicle and the like has been described, the energy storage device is not limited to one mounted on a movable body, but may be an energy storage device included in stationary equipment. As the stationary equipment, an uninterruptible power supply device or an emergency power supply device, which is installed in a factory, a home, or an office, an energy storage device connected to a transmission system for power supply distribution and electric load leveling, and so on can be exemplified.

What is claimed is:

1. An energy storage device management method for deciding a state of charge (SOC) estimated value, which is a value indicating a state of charge of an energy storage device, comprising:
   executing first and second SOC estimation methods for estimating an SOC of the energy storage device in ways different from each other; and
   adjusting a reset value as the SOC estimated value when a first SOC region and a second SOC region are different from each other,
   wherein a V-SOC correlation between a voltage and the state of charge of the energy storage device is sectioned into a plurality of SOC regions,
   wherein the first SOC region is the SOC region that the SOC estimated by the first SOC estimation method belongs to, and the second SOC region is the SOC region that the SOC estimated by the second SOC estimation method belongs to, and
   wherein the reset value is set to:
     a limit value of the second SOC region on a side of the second SOC region which is close to the first SOC region; or
     a value between the limit value of the second SOC region on the side of the second SOC region which is close to the first SOC region and a median value of the second SOC region.

2. The energy storage device management method according to claim 1, wherein the first SOC estimation method is a method in which the SOC of the energy storage device is estimated, using data obtained by measuring a current flowing in/from the energy storage device, and the second SOC decision method is a method in which the SOC of the energy storage device is estimated, using data obtained by measuring the voltage of the energy storage device.

3. The energy storage device management method according to claim 1, wherein, when the first SOC region and the second SOC region are a same, the SOC estimated based on the first SOC estimation method is employed as the SOC estimated value.

4. The energy storage device management method according to claim 1, wherein one of the SOC regions includes a region corresponding to a voltage flat region in which as to the voltage of the energy storage device, change of the voltage to the change of the SOC in the V-SOC correlation is smaller than that in an other region.

5. The energy storage device management method according to claim 1, further comprising:
   adjusting the reset value as the SOC estimated value when the first and second SOC estimation methods do not match with each other.

6. The energy storage device management method according to claim 1, wherein, when the first SOC region and the second SOC region match with each other, the SOC estimated based on the first SOC estimation method is employed as the SOC estimated value.

7. The energy storage device management method according to claim 1, wherein the first and second SOC estimation methods are applied in the first SOC regions and the second SOC region.

8. An energy storage device management apparatus, comprising:
   an information processor adapted to output a state of charge (SOC) estimated value, which is a value indicating a state of charge of an energy storage device, and to execute first and second SOC estimation methods for estimating an SOC of the energy storage device in ways different from each other,
   wherein a V-SOC correlation between a voltage and the state of charge of the energy storage device is sectioned into a plurality of SOC regions,
   wherein the information processor is further adapted to adjust a reset value as the SOC estimated value when a first SOC region and a second SOC region are different from each other, the first SOC region being the SOC region that the SOC estimated by the first SOC estimation method belongs to, and the second SOC region being the SOC region that the SOC estimated by the second SOC estimation method belongs to, and
   wherein the information processor is further adapted to set the reset value to:
     a limit value of the second SOC region on a side of the second SOC region which is close to the first SOC region, or
     a value between the limit value of the second SOC region on the side of the second SOC region which is close to the first SOC region and a median value of the second SOC region.

9. The energy storage device management apparatus according to claim 8, wherein the first SOC estimation method is a method in which the SOC of the energy storage device is estimated, using data obtained by measuring a current flowing in/from the energy storage device, and the second SOC estimation method is a method in which the SOC of the energy storage device is estimated, using data obtained by measuring the voltage of the energy storage device.

10. The energy storage device management apparatus according to claim 8, wherein, when the first SOC region and the second SOC region are a same, the SOC estimated based on the first SOC estimation method is employed as the SOC estimated value.

11. The energy storage device management apparatus according to claim 8, wherein one of the SOC regions includes a region corresponding to a voltage flat region in which as to the voltage of the energy storage device, change of the voltage to the change of the SOC in the V-SOC correlation is smaller than that in an other region.

12. The energy storage device management apparatus according to claim 11, wherein the V-SOC correlation includes information regarding a plurality of the voltage flat regions.

13. The energy storage device management apparatus according to claim 8, wherein the energy storage device includes a lithium ion battery including an iron-phosphate based positive active material.

14. An energy storage device module, comprising:
   an energy storage device; and the energy storage device management apparatus according to claim 8.

15. The energy storage device management apparatus according to claim 8, wherein the information processor further adjusts the reset value as the SOC estimated value when the first and second SOC estimation method do not match with each other.

16. The energy storage device management apparatus according to claim 8, wherein the first and second SOC estimation methods are applied in the first SOC region and the second SOC region.

17. An energy storage device management program for causing a computer that controls an energy storage device to decide a state of charge (SOC) estimated value, which is a value indicating a state of charge of the energy storage device, the computer executing first and second SOC estimation methods for estimating an SOC of the energy storage device in ways different from each other, wherein the program causes the computer to perform:
  adjusting a reset value as the SOC estimated value when a first SOC region and a second SOC region are different from each other,
  wherein a V-SOC correlation between a voltage and the state of charge of the energy storage device is sectioned into a plurality of SOC regions,
  wherein the first SOC region is the SOC region that the SOC estimated by the first SOC estimation method belongs to, and the second SOC region is the SOC region that the SOC estimated by the second SOC estimation method belongs to, and
  wherein the reset value is set to:
    a limit value of the second SOC region on a side of the second SOC region which is close to the first SOC region, or
    a value between the limit value of the second SOC region on the side of the second SOC region which is close to the first SOC region and a median value of the second SOC region.

18. A movable body, comprising:
  an energy storage device; and
  the energy storage device management apparatus according to claim 8.

19. The energy storage device management program according to claim 17, wherein the program further causes the computer to perform:
  adjusting the reset value as the SOC estimated value when the first and second SOC estimation methods do not match with each other.

20. The energy storage device management program according to claim 17, wherein the first and second SOC estimation methods are applied in the first SOC region and the second SOC region.

* * * * *